United States Patent
Andoh et al.

(10) Patent No.: US 6,740,949 B2
(45) Date of Patent: May 25, 2004

(54) SUPPORTING STRUCTURE FOR A SOLID STATE IMAGE SENSING DEVICE

(75) Inventors: Jun Andoh, Tokyo (JP); Tatsuya Tsuyuki, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 19 days.

(21) Appl. No.: 10/231,282

(22) Filed: Aug. 30, 2002

(65) Prior Publication Data

US 2003/0052381 A1 Mar. 20, 2003

(30) Foreign Application Priority Data

Sep. 19, 2001 (JP) ........................................ 2001-285967

(51) Int. Cl.[7] ......................................... H01L 31/0232
(52) U.S. Cl. ....................................... 257/432; 257/433
(58) Field of Search ................................ 257/431, 432, 257/434, 680, 666

(56) References Cited

U.S. PATENT DOCUMENTS 5,087,964 A * 2/1992 Hatta
5,358,165 A    10/1994 Andoh
5,523,608 A *  6/1996 Kitoaka et al.
5,811,799 A *  9/1998 Wu
6,472,247 B1   10/2002 Andoh et al.
6,518,656 B1 * 2/2003 Nakayama et al.
6,545,332 B2 * 4/2003 Huang

* cited by examiner

*Primary Examiner*—Sheila V. Clark
(74) *Attorney, Agent, or Firm*—Oblon, Spivak, McClelland, Maier & Neustadt, P.C.

(57) ABSTRACT

Disclosed is a solid state image sensing device. The solid state image sensing device comprises a semiconductor chip for image sensing which has at least one of photoelectric conversion element line; and a package into which the semiconductor chip is received. The package is composed of an insulating package body which has the semiconductor chip mounted on a flat inner bottom surface of a concave portion; a transparent cover glass to be fixed on an upper surface of an outer frame of the concave portion for sealing the concave portion; and a lead frame which is brought out to the outside of the package body. The solid state image sensing device has a reference plane for attaching onto an image input apparatus is arranged on the package. The reference plane for attaching is made parallel to the inner bottom surface of the concave portion on which the semiconductor chip is mounted.

12 Claims, 11 Drawing Sheets

UP ← → DOWN

SUPPORTING STRUCTURE FOR A SOLID STATE IMAGE SENSING DEVICE

BACKGROUND OF THE INVENTION

1. Field of the Invention

The present invention relates to an improvement in a structure of a solid state image sensing device used in an image forming apparatus such as a copy machine, printer, facsimile machine and so on or an image input apparatus utilized in an image scanner.

2. Description of the Prior Art

In an image scanner or an image forming apparatus such as copy machine, printer, facsimile machine and the like, an image input apparatus (image sensing apparatus) to input an optical image of an object as a target to be image picked up is equipped, and in the image input apparatus a solid state image sensing device (charge coupled device, hereinafter referred to as CCD) is used.

FIGS. 13(A) and 13(B) are of a schematic illustration and its perspective view to show a layout of image focusing optical system which constitutes an image input apparatus, and the image focusing optical system includes a solid state image sensing device 1 and a lens L, and it is arranged to face against an object D to be image picked up (manuscript copy).

In FIG. 13, the solid state image sensing device 1 is an electronic component having a structure to be equipped on a circuit board 18, in that an incoming light receiving surface is arranged to be located at a position at which optical image of the object to be image picked up D is focused by the lens L.

At the same time, in FIG. 13(B), the solid state image sensing device 1 is mounted on a surface of the circuit board 18 in the image input apparatus. Herein, the circuit board 18 has a function to drive the solid state image sensing device 1, to give an electrical process on output signal from the solid state image sensing device 1 which is generated in connection with a receiving of the optical image and then to output the processed signal to a control portion of the image input apparatus body (not shown).

At this time, especially when the object D to be image picked up in this case is a photographic image for the image input apparatus, on a semiconductor chip 3 which constitutes the solid state image sensing device 1 used a plurality of micro photoelectric conversion elements 3a are arranged in a single line. By this arrangement the image is input as a line image by the photoelectric conversion elements 3a. Especially, in the color photographic image input apparatus to input a color photographic image, a color semiconductor chip 3 is used in that three lines 3a, 3b and 3c of pixels respectively having a peak of the spectral sensitivity in Red area (hereinafter referred to as simply R), Green area (hereinafter referred to as simply G) and Blue area (hereinafter referred to as simply B) as shown in FIG. 13(C) are disposed.

Further, the image sensing device 1 is classified in a several kind by their external structure (package structure). Among all of them recently a solid state image sensing device of Ceramic Dual Inline Package (hereinafter refereed to as "Cer DIP") type and a solid state image sensing device with resin made package are increased because of its advantage in manufacturing cost (cheap) and they become popular to be used in the image input apparatus.

FIGS. 14(A), (B) and (C) are a plan view, a back view and a cross sectional view taken along the A—A line to show a basic structure of a normal (conventional) laminated type solid state image sensing device 1A (for color).

The laminated type solid state image sensing device 1A has a structure in which a semiconductor chip 3 is accommodated in a package 2 and photoelectric conversion elements are mounted on the semiconductor chip 3. The package 2 includes a package body 5 which is made of ceramic thin plates having a predetermined shape being laminated in a box form; a semiconductor chip 3 on which the photoelectric conversion element is mounted, is received in a concave portion 6 of the package body 5; lines of photoelectric conversion element 3a, 3b and 3c which are disposed on the incoming light receiving surface of the semiconductor chip 3; and a transparent cover glass 15 to seal an opening of the concave portion 6 of package body 5.

The package body 5 mounts the semiconductor chip 3 in an inner bottom (on an upper surface of the bottom plate) of the concave portion 6 and has a lead frame 7 which is brought out with passing through side walls of the package body 5, and inner end portion of the lead frame 7 is electrically connected to electrodes of the semiconductor chip 3 by lead wires 8.

Next FIGS. 15(A), (B) and (C) show a basic structure of a normal (conventional) Cer DIP type solid state image sensing device 1B (herein for color). The Cer DIP type solid state image sensing device 1B has a structure in which a semiconductor chip 3 is received in a package 2 and the photoelectric conversion elements are mounted on the semiconductor chip 3. The package 2 includes a package body 5; a semiconductor chip 3 on which the photoelectric conversion elements are mounted, is received in a concave portion 6 of the package body 5; lines of photoelectric conversion elements 3a, 3b and 3c which are disposed on the incoming light receiving surface of the semiconductor chip 3; and a transparent cover glass 15 to seal an opening of the concave portion 6 of the package body 5.

The package body 5 has a structure in which an annular window frame 10b made of ceramic is bonded to be integrated as a unit on one surface of a plate formed base frame (bottom plate) 10a made of ceramic through a sealing glass 10c, and at the same time a lead frame 7 is included in a state that the lead frame is brought out with passing through the sealing glass 10c and the lead frame 7 is electrically connected to electrodes of the semiconductor chip 3 mounted on an inner bottom of the concave portion by lead wires 8.

FIG. 16 shows a cross sectional shape of a basic structure of a solid state image sensing device 1C (in this case for color) of a resin packaging type. A package 2 of this solid state image sensing device 1C has a structure in that a semiconductor chip 3 is mounted via a metal plate 12 on an inner bottom surface of a concave portion 11a in a resin packaging body 11, photoelectric conversion elements are mounted on the semiconductor chip 3 and the electrode on the semiconductor chip are connected through lead wires (bonding wires) 8 to a lead frame 7 which is disposed in such a manner to pass through side walls of the packaging body 11.

Usually a thermosetting resin is used for the resin packaging body 11. An opening in the concave portion 11a is sealed by a cover glass 15.

Herein the image sensing device 1 is usually mounted on the circuit board 18 by means that the lead frames 7 is soldered on a wiring pattern of the circuit board 18 as shown in FIG. 13(A), and the circuit board 18 is mounted on a housing body and so on which is attached on the image input apparatus (image sensing apparatus).

However, it is difficult to mount the solid state image sensing device 1 with high precision on a predetermined position of the circuit board 18 because it has a soldered structure on the circuit board. Though the circuit board 18 can be mounted accurately on the image input apparatus, incorrectness of positions between the solid state image sensing device 1 and the circuit board 18 sometimes brings an error of positional alignment between the solid state image sensing device 1 and the component parts such as the lens L and the like as a result.

The error of positional alignment of this kind brings a severe error in positional alignment between the solid state image sensing device 1 and an image of the manuscript copy D as an object to be image picked up, and accordingly causes an image sensing quality deterioration.

Next FIGS. 17(A) and (B) show a structure of holding means (chucking means) to be used for holding the solid state image sensing device when the solid state image sensing device 1 is mounted on the circuit board 18.

Holding means 50 has a pair of holding portions 51 which are supported capable of reciprocating in a direction shown by the arrow located at a top portion of a working arm which is not shown in the drawing, a positional alignment is performed by that the solid state image sensing device 1 is moved and mounted on the circuit board 18 in a state that predetermined portions of the package of the solid state image sensing device 1 are held by holding surfaces 51a of the respective holding portions 51. However, a provability of performing accurate positional alignment on the circuit board with high precision is never enough because sufficient attention has not been paid for an attitude or portions when an outer surface of the solid state image sensing device 1 is made to abut with the holding surfaces 51a of the holding means 51.

Because of these facts, the applicant of the present invention has proposed an adjusting method for positional relation of the solid state image sensing device 1 on the circuit board 18 in that the solid state image sensing device 1 is given micro motions along five axes of X, Y, Z, β and γ as shown in FIG. 13(B) in at the stage of manufacturing of the image input apparatus in order to make the line images which are focused by the lens L being located accurately on the solid state image sensing device 1 and at the same time to read out optical characteristics (focus, magnification and the like) with a predetermined required accuracy.

The solid state image sensing device 1 that has been achieved the positional adjustment as described above is attached on a holding member which is mounted on the image input apparatus by means of a fixing means such as adhesion, screw and so on.

However, it is not easy to achieve a fixing the solid state image sensing device 1 with a high degree of accuracy in order to make the line images which are focused by the focusing lens L being located accurately on the solid state image sensing device 1 and at the same time to read out optical characteristics with a predetermined required accuracy when the solid state image sensing device 1 has been achieved the positional adjustment along the five axes in a positional adjustment process before the solid state image sensing device 1 is adhered and fixed, and there has been no proposals of concrete structure to raise the manufacturing yield or to prevent an occurrence of deterioration of fixing force for the solid state image sensing device 1.

In Japanese Patent Publication No. Hei 05 (1993)-226493 titled in "Glass Sealed Type Integrated Circuit" a structure that glass meniscus surface (it means side wall of the sealing glass) is made in convex form, is disclosed to prevent an occurrence of cracks at the sealing glass. Also in Japanese Patent No. 2576694 titled in "Semiconductor Apparatus" a structure that a length of the window frame (cap) is made longer than that of a base is disclosed to increase an adhesive strength by a wider adhering area.

The package structure disclosed in each of these patents and patent publications seems to be similar to a structure of the present invention which will be described later, however the parts disclosed in the publications are not the solid state image sensing device.

That is to say the semiconductor chip which is built in the package is not the photoelectric conversion element but a storage element such as memory (ROM and the like). In other words a necessity of precise positional adjustment is not found when these parts are mounted on the circuit board in some kind of electronic equipment and so on because they are the storage element. In short, the technical problem is quite different from that of the present invention, namely, a standard for assembling. Accordingly the package for the storage element which are disclosed in the above described publications, do not have the structure to be employed as a standard for assembling.

SUMMARY OF THE INVENTION

The present invention has been made in reference to the above described problems, it is one object of the present invention to provide a supporting structure for the solid state image sensing device by that a cost reduction is realized by eliminating complicated mechanism element to the utmost, the package can be mounted on the circuit board with a high degree of accuracy so as to raise the manufacturing yield, and at the same time an occurrence of the deterioration of quality after the product has been manufactured is prevented, a fixing the solid state image sensing device with a high degree of accuracy in order to make the line images which are focused by the focusing lens being located accurately on the solid state image sensing device is achieved and at the same time reading out of the optical characteristics (focus, magnification) with a predetermined required accuracy is achieved, and the position of it can be adjusted by the micro motions along the five axes of X, Y, Z, β and γ before the solid state image sensing device is adhered and fixed.

To solve the above described problems, a solid state image sensing device in accordance with the present invention is characterized by that the solid state image sensing device including a semiconductor chip to image sensing which has at least one of photoelectric conversion element line; and a package into which the semiconductor chip is received, and the package is composed of an insulating package body which has a concave portion on the upper surface and the semiconductor chip mounted on a flat inner bottom surface of the concave portion; a transparent cover glass to be fixed on an upper surface of outer frame of the concave portion of the package body for sealing the concave portion; and a lead frame which is connected to electrodes on the semiconductor chip within the package body and is brought out to outside of the package body, further the solid state image sensing device has a reference plane for attaching onto an image input apparatus is arranged on the package, and the reference plane for attaching is made parallel to the inner bottom surface of the concave portion on which the semiconductor chip is mounted.

The above described reference plane for attaching is characterized by a surface which is located orthogonally to a light axis along which an optical image comes into an incoming light receiving surface of the semiconductor chip through the cover glass.

The above described package is characterized by composed of the package body including a base frame which is made of flat ceramic plate to constitute the bottom plate; and an annular window frame made of ceramic to be fixed on one of surface of the base frame through a sealing glass; a transparent cover glass to be fixed on upper surface of outer frame of the window frame; and a lead frame which is brought out outwardly passing through the sealing glass.

The above described package body is characterized by made of resin; the device having a structure in that the semiconductor chip is mounted on a metal plate located on the bottom surface of the concave portion of the package body; the reference plane for attaching onto the image input apparatus being arranged on the metal plate.

The above described reference plane for attaching onto the image input apparatus is characterized by arranged on an upper surface of the cover glass.

The above described reference plane for attaching onto the image input apparatus is characterized by arranged on an upper surface or the outer frame of the concave portion of the package body or an upper surface of the window frame.

The above described reference plane for attaching onto the image input apparatus is arranged on a bottom surface of the concave portion of the package body or on an upper surface of the base frame.

The above described reference plane for attaching onto the image input apparatus is characterized by arranged on a protruding surface which is made any one of the bottom plate of the package body, the base frame or the metal plate protruding to any one of direction.

DETAILED DESCRIPTION OF PREFERRED EMBODIMENTS

Figure 1A:
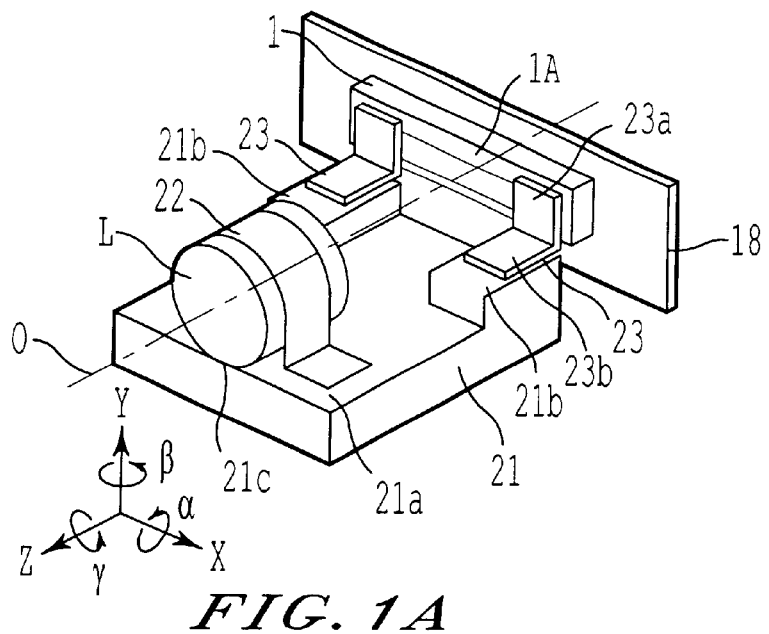
FIGS. 1(A), (B) and (C) are a perspective view, a front view and an enlarged view of relevant portion to show a supporting structure of the solid state image sensing device (substantial structure of the image input apparatus) in accordance with one embodiment of the present invention.
Figure 1B:
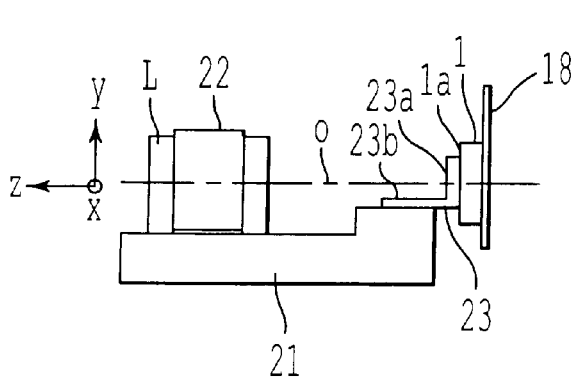

As shown in FIG. 1, in a supporting structure in accordance with the present invention, an image focusing lens L is held and fixed on a flat surface 21a by a lens holding plate 22 and a solid state image sensing device holding member 21 on which pedestals 21b are disposed to protrude respectively on its two back corners, an intermediate holding member 23 which is made of an L shaped transparent material and which is adhered and fixed with its bottom surface of a bottom plate 23b on the respective pedestals 21b, a solid state image sensing device 1 which is adhered and fixed with its front surface on the respective back surfaces of its standing plates 23a of the intermediate holding member 23 and a circuit board 18 on which the solid state image sensing device 1 is mounted, are included. The circuit board 18 is fixed on an appropriate portion of the image input apparatus body (not shown).

As for the solid state image sensing device 1 above described a laminated type solid state image sensing device 1A, a Cer DIP type solid state image sensing device 1B and a resin packaging type solid state image sensing device 1C can be employed and all of these solid state image sensing devices are mounted on a wiring pattern of the circuit board 18 by means of soldering at a lead frame 7.

Figure 13A:
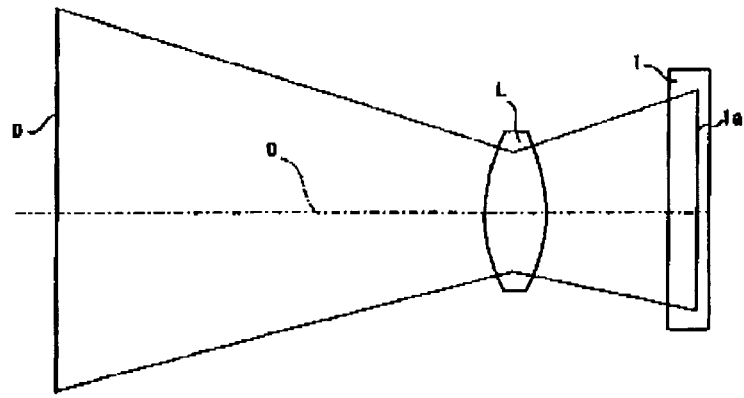
FIGS. 13(A), (B) and (C) are explanatory diagrams to show a structure of an image input apparatus in the prior art.
Figure 13B:
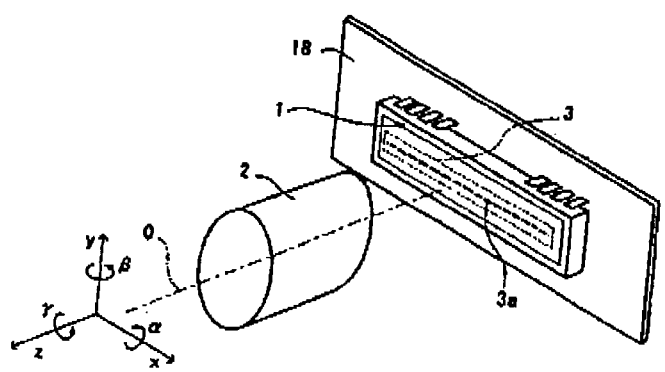
Figure 13C:
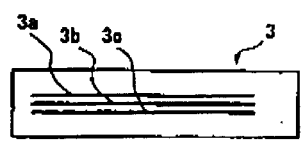
Figure 14A:
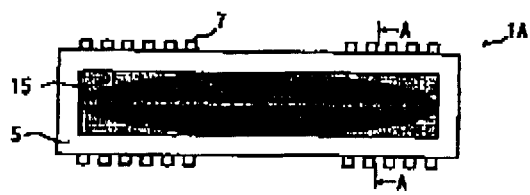
FIGS. 14(A), (B) and (C) are a plan view, a back view and a cross sectional view cut along A—A line to show a structure of a laminated type solid state image sensing device in the prior art.
Figure 14C:
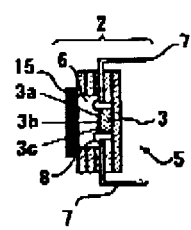
Figure 14B:
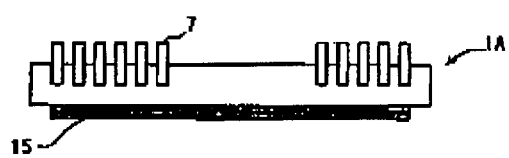
Figure 15A:
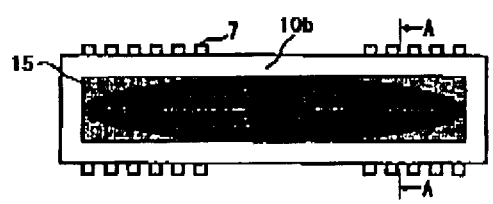
FIGS. 15(A), (B) and (C) are a plan view, a back view and a cross sectional view cut along A—A line to show a structure of the Cer DIP type solid state image sensing device in the prior art.
Figure 15C:
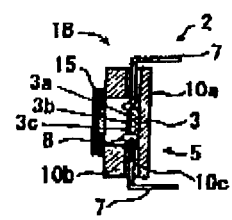
Figure 15B:
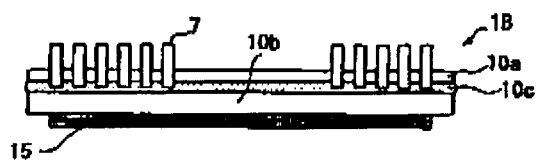

An image focusing lens L for an optical image of the manuscript copy to be focused on photoelectric conversion element lines 3a, 3b and 3c (See FIG. 13(C)) is located by a V grooved ditch 21c on the flat surface 21a of the holding member 21, and supported to be fixed by the lens holding plate 22. At this embodiment an optical axis O of the lens L coincides with a direction of Z axis. Also the direction of X axis coincides with a main scanning direction of the image input apparatus, and the direction of Y axis coincides with a sub scanning direction of the image input apparatus.

Further the solid state image sensing device 1 is mounted on the circuit board 18. At this point the circuit board 18 includes circuit components to drive the solid state image sensing device 1, to give an electrical process on output signal from the solid state image sensing device 1 which is generated in connection with a receiving of the optical image and then to output the processed signal to a control portion of the image input apparatus body (not shown). And the solid state image sensing device 1 is attached on the holding member 21 via the L shaped intermediate holding member 23.

The intermediate holding member 23 is made of a transparent material. Because of this the optical image focused by the lens L pass through the standing plate 23a of the intermediate holding member 23 and it is focused on the lines of photoelectric conversion elements 3a, 3b and 3c of the semiconductor chip which is located in front of the solid state image sensing device 1.

As for a method to connect between a front surface of the package of the solid state image sensing device 1 and a back surface of the standing plate 23b of the intermediate holding member 23, an adhesion may be utilized. It is advantageous in the productivity that an ultraviolet curing adhesive material with a ten seconds of required hardening time, is used.

Figure 1C:
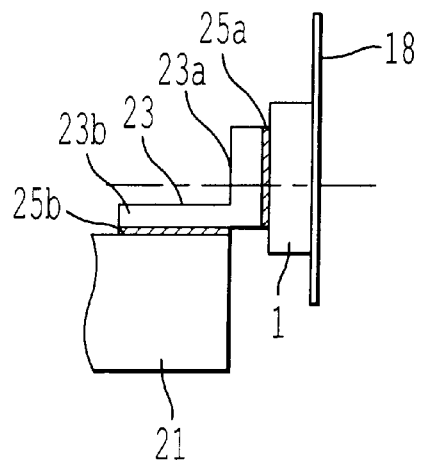

In the enlarged view of FIG. 1(C) to show an adhered state, the intermediate holding member 23 is fixed at its bottom surface of the bottom plate 23b on the pedestal 21b of the holding member 21 by an ultraviolet curing adhesive material layer 25b, and the back surfaces of respective standing plate 23a are fixed on outer portions of the solid state image sensing device (both end portions of front surface side) by an ultraviolet curing adhesive material layer 25a. Because the intermediate holding member 23 is made of a transparent material, the ultraviolet curing adhesive material layers 25a and 25b can be hardened by the ultraviolet ray (not shown) which is passed through the intermediate holding member 23.

In a production process at just before and just after the adhesive material hardening step, the solid state image sensing device 1, the holding member 21 and the intermediate holding member 23 are in a state that the holding member 21 and the solid state image sensing device 1 are held by the holding member, and on the contrary the intermediate holding member 23 are not held. By taking this holding state, in a mechanism when the adhesive material is hardened, respective thickness of the adhesive material layers 25a and 25b can be minimized in the least and at the same time an accuracy of positional relation between both adhered members can be kept in high level without any effect from a shrinkage after the hardening by means of the structure with an arrangement of the intermediate holding member being interpositioned as described in Japanese Patent Publication No. Hei 10 (1998)-309801 which is an application by the applicant of present invention.

In other words, because motions (displacement) of the respective parts caused by the shrinkage of adhesive material when the adhesive material layers 25a and 25b are hardened, are converted into a motion that the intermediate holding member 23 comes nearer to the solid state image sensing device 1 and the solid state image sensing device holding member 21 such that an occurrence of misalignment of the solid state image sensing device 1 itself is cut down, there is realized the solid state image sensing device structure in that the solid state image sensing device 1 can be located with a high degree of accuracy in relation to the solid state image sensing device holding member 21.

In the above described adhering and fixing process the thickness of adhesive material layers 25a and 25b are thinner the better in order to reduce the effect from the shrinkage by hardening. However, there comes about a necessity that to set enough thickness of the adhesive material layers to fill up a difference between the concave and the convex of these surfaces in compliance with a degree of flatness in surfaces of the solid state image sensing device 1, the holding member 21 and the intermediate holding member 23 in actual manufacturing process.

Herein in the manufacturing process the intermediate holding member 23 have to be located and adjusted at a predetermined position before the adhesive materials are hardened. In other words it is requested that the optical characteristics (focus, magnification) are read out with a predetermined required degree of accuracy in this positional adjustment process in order to adjust the position of solid state image sensing device 1 by micro motions along the five axes of X, Y, Z, β and γ.

First, when the adjustment along the X direction is performed the intermediate holding member 23 and the solid state image sensing device 1 are adjusted in cooperation with gliding motion along the X direction by means that the intermediate holding member 23 is moved along the X direction on the adhesive material layer 25b which is coated on the pedestal 21b.

When the adjustment along the Y direction is performed the solid state image sensing device 1 is adjusted in a gliding motion along the Y direction by means that the solid state image sensing device 1 is moved along the Y direction on the adhesive material layer 25a which is coated on the back surface of standing plate 23a.

When the adjustment along the Z direction is performed the intermediate holding member 23 is adjusted in a gliding motion along the Z direction by means that the intermediate holding member 23 is moved along the Z direction on the adhesive material layer 25b.

When the adjustment along the β direction is performed among the rotational adjustment direction, the intermediate holding member 23 and the solid state image sensing device 1 are adjusted in cooperation with rotating motion along the β direction by means that the intermediate holding member 23 is rotated along the β direction on the adhesive material layer 25b.

When the adjustment along the γ direction is performed among the rotational adjustment direction, the solid state image sensing device 1 is adjusted in a rotating motion along the γ direction by means that the solid state image sensing device 1 is rotated along the γ direction on the adhesive material layer 25a.

The individual motion of these respective adjustments along X, Y, Z, β and γ directions can be perfectly performed independently from other directions. It is because that the connecting surfaces (back surface of the standing plate 23a and bottom surface of the bottom plate 23b) on which the adhesive material layers 25a and 25b are made respectively, are composed in a state crossing in right angle. Because the two adhering surfaces are made to be in right angle, it is made possible that the respective sliding motions are also matched with the rectangular coordinate.

One conspicuous configuration and effect of this embodiment is that it is made possible to achieve high optical characteristics without performing an adjustment on the rotating direction α around the X axis because the front surface (upper surface) 1a of solid state image sensing device 1 is arranged to be in parallel with the incoming light receiving surface (surface on which the photoelectric conversion element are disposed) of semiconductor chip 3 which is arranged in the package 2 of solid state image sensing device, there causes no problem that a distance between the image focusing lens L and the solid state image sensing device 1 becomes different for every pixel in relation to the rotating direction α around the X axis and it does not effect on the optical characteristics.

Herein, to perform the above described positional adjustment there is a necessity to perform the adjustment while the solid state image sensing device 1 is held by a holding means which composes the manufacturing apparatus (not shown) when it is manufactured. At this time a method may also be employable that the circuit board 18 on which the solid state image sensing device 1 is mounted, is selected and held as a target of holding instead of holding directly the solid state image sensing device 1 by the holding means. However, the circuit board 18 has a problem in rigidity. This is because that the circuit board 18 is mere a thin plate in its shape and a metal with much rigidity is usually not used to make the circuit board.

As described above when a metal with less rigidity is used for the circuit board 18, an elastic deformation in the circuit board 18 is caused by the holding, and at the same time it may become a reason to cause the positional displacement of the solid state image sensing device 1. In the case for storage element such as memory it does not cause any trouble, however as described above in case for solid state image sensing device used in the image input apparatus for which a high degree of accuracy is required, the amount of positional displacement brings a much severe problem. Accordingly it is preferable to select the solid state image sensing device 1 as the target to hold directly especially at manufacturing process and at adjustment process.

Figure 17A:
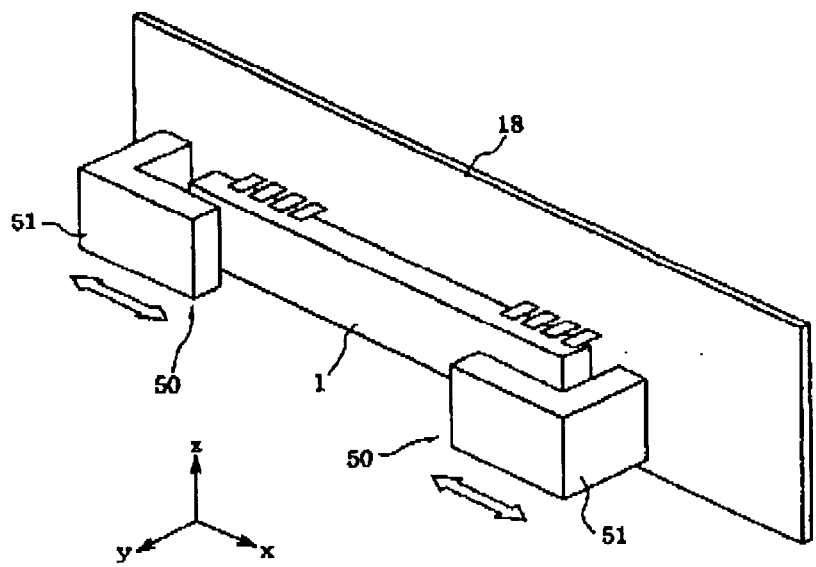
FIGS. 17(A) and (B) are explanatory diagrams to show a structure and an operation of a holding means in the prior art.
Figure 17B:
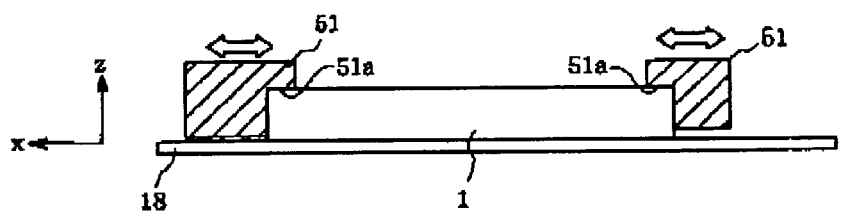

As described above it is made possible that positional displacement in the α direction is minimized when the solid state image sensing device 1 is held by the holding means (See FIG. 17) and the adhering process and the adjusting process are performed by means of holding in the state in which the front surface 1a (connected surface) of the solid state image sensing device 1 and the identical plane are selected as the reference plane. In other words by means that a reference plane 51a which is arranged on a holding portion 51 of a holding means 50 shown in FIG. 17 is made to contact with a reference plane on the solid state image sensing device 1 side, an orientation of the solid state image sensing device in relation to the holding means can be decided in univocal.

Hereinafter an explanation about the solid state image sensing device having a structure which is suitable to be performed the adjusting process along the respective directions while the solid state image sensing device is held by the holding means, will be given.

Figure 2A:
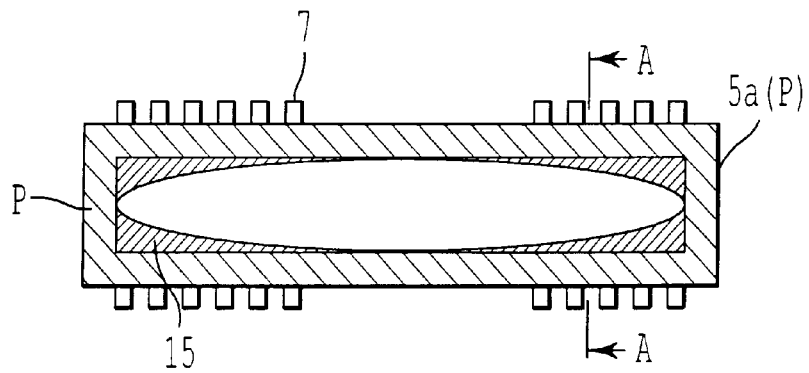
FIGS. 2(A), (B) and (C) are a plan view, a back view and a cross sectional view cut along A—A line to show a structure of the laminated type solid state image sensing device (CCD) in accordance with a first embodiment of the present invention.

FIGS. 2(A), (B) and (C) are a plan view, a back view and a cross sectional view cut along A—A line to show a structure of the laminated type solid state image sensing device (CCD) in accordance a first embodiment of the present invention.

This laminated type solid state image sensing device 1A has a structure in which the semiconductor chip 3 is accommodated in the package 2 and the photoelectric conversion element are mounted on the semiconductor chip 3.

The package 2 includes the package body 5 which is made of ceramic thin plates having a predetermined shape being laminated in a box form, the semiconductor chip 3 on which the photoelectric conversion element are mounted and which is mounted on the inner bottom surface of the concave portion 6 of package body 5, the photoelectric conversion element lines 3a, 3b and 3c which are located on the incoming light receiving surface of semiconductor chip 3 and the transparent cover glass 15 to seal the opening on concave portion 6 of the package body 5.

On the package body 5 the semiconductor chip 3 is mounted on the inner bottom surface (upper surface of the bottom plate) of concave portion 6 at the same time the package body 5 has the lead frame 7 which is brought out with passing through side walls and inner end portion of the lead frame 7 are connected to electrodes of the semiconductor chip 3 by the lead wire 8.

The conspicuous structure of the image sensing device 1 in accordance with this embodiment is that a reference plane P which is used when the package is attached on a housing (not shown) of the image input apparatus, is arranged in the package 2 and the reference plane P for attaching is made as a parallel plane to a flat inner bottom surface 30 of the package body on which the semiconductor chip 3 is mounted.

Figure 2B:
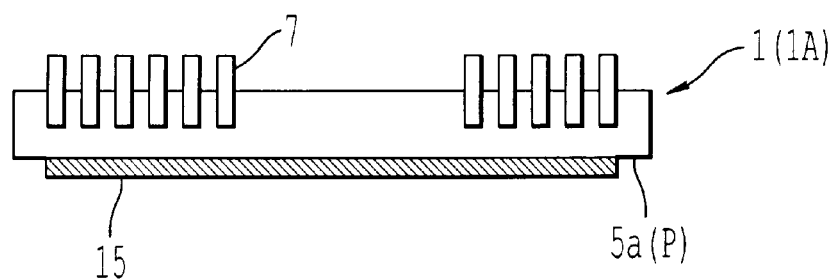
Figure 2C:
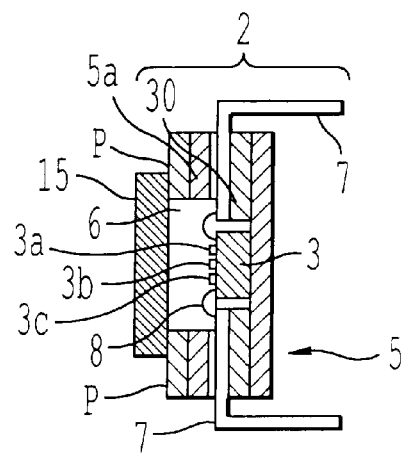

To be more precise the solid state image sensing device 1 shown in FIG. 2 illustrates one example as one example of layout of connecting surface in which the reference plane P is arranged on an upper surface (upper surface of the outer frame) of the package body 5. At this point the upper surface 5a of the package body coincides with the front surface (upper surface) of solid state image sensing device 1.

The reference plane P is made possible to be mounted on the circuit board 18 always in an orientation with a high degree of accuracy by means of abutment with a reference plane 51a of the holding portion 51 of holding means 50 shown in FIG. 17.

Figure 3A:
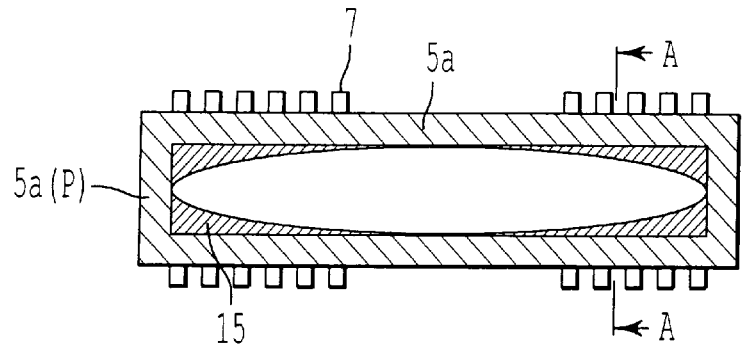
FIGS. 3(A), (B) and (C) are a plan view, a back view and a cross sectional view cut along A—A line to show a structure of the Cer DIP type solid state image sensing device (CCD) 1B in accordance with a second embodiment of the present invention.

Next FIGS. 3(A), (B) and (C) are a plan view, a back view and a cross sectional view cut along A—A line to show a structure of the Cer DIP type solid state image sensing device (CCD) 1B in accordance with a second embodiment of the present invention.

The Cer DIP type solid state image sensing device 1B has a structure in which the semiconductor chip 3 is accommodated in the package 2 and the photoelectric conversion element are mounted on the semiconductor chip 3. The package 2 includes the package body 5, the semiconductor chip 3 on which the photoelectric conversion element are mounted and which is received in the concave portion 6 of package body 5, the photoelectric conversion element lines 3a, 3b and 3c which are located on the incoming light receiving surface of semiconductor chip 3 and the transparent cover glass 16 to seal the opening on concave portion 6 of the package body 5.

The package body 5 has a structure in that an annular window frame 10b made of ceramic is bonded on one surface of a base frame 10a which is in flat plate shape made of ceramic via a sealing glass 10c to be integrated and at the same time the lead frame 7 which is electrically connected via the lead wire 8 with the electrodes on the semiconductor chip 3 mounted on the bottom surface of the concave portion, is brought out with passing through the sealing glass 10c.

In the Cer DIP type solid state image sensing device 1B in accordance with this embodiment it is conspicuous that the reference plane P which is used to attach it on the image input apparatus housing (not shown), is made to be a parallel plane to the flat surface 30 which is the bottom surface of concave portion in the package body 5 onto which the semiconductor chip 3 is mounted, in other words, which is the upper surface of the base frame 10*a*. To be more precise, this embodiment shows a case as one example of layout of connecting surface in which the reference plane P which is used when the solid state image sensing device is attached to the housing of image input apparatus, is arranged on an upper surface (upper surface of the outer frame) 5*a* of the window frame 10*b*.

Figure 16:
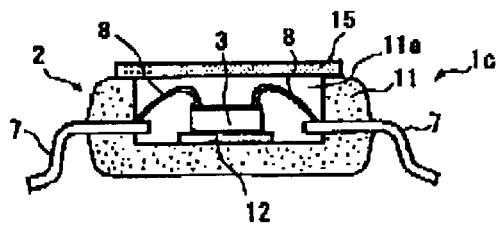
FIG. 16 is a cross sectional view of a resin packaging type solid state image sensing device in the prior art.

Herein when in case the structure in accordance with this embodiment is applied to the solid state image sensing device 1C which is composed with the resin made package shown in FIG. 16, the reference plane P is set on the upper surface (upper surface of the outer frame) of resin package 11 which is parallel to the flat inner bottom surface of concave portion 11*a* of the resin package body 11 shown in FIG. 16.

Figure 3B:
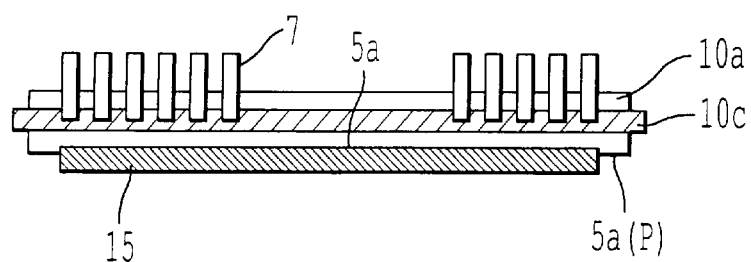
Figure 3C:
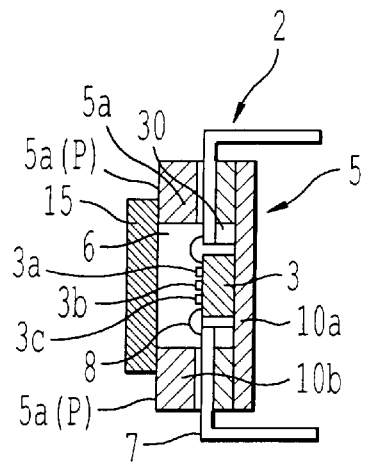

As described above in the embodiments shown in FIG. 2 and FIG. 3 when the adhering process and the adjustment process are performed with the solid state image sensing device 1 is held by the holding means, the positional displacement along the α direction can be minimized when the solid state image sensing device is held by means that the identical plane of front surface 1*a* of the solid state image sensing device 1, upper surface 5*a* (contacting surface) of the package body or upper surface 5*a* of the window frame 10*b* is selected as the reference plane P and held such that the reference plane P is made to abut with the reference plane of holding means.

At the same time by arranging the reference plane P for attaching the semiconductor chip 3 in the bottom surface (upper surface of the bottom plate) in concave portion of the package body and in the base frame respectively, a parallelism with the incoming light receiving portion can be easily attained and the solid state image sensing device 1 can be performed the locating and positional adjustment in relation to the holding member 21 for solid state image sensing device with a high degree of accuracy.

Figure 4:
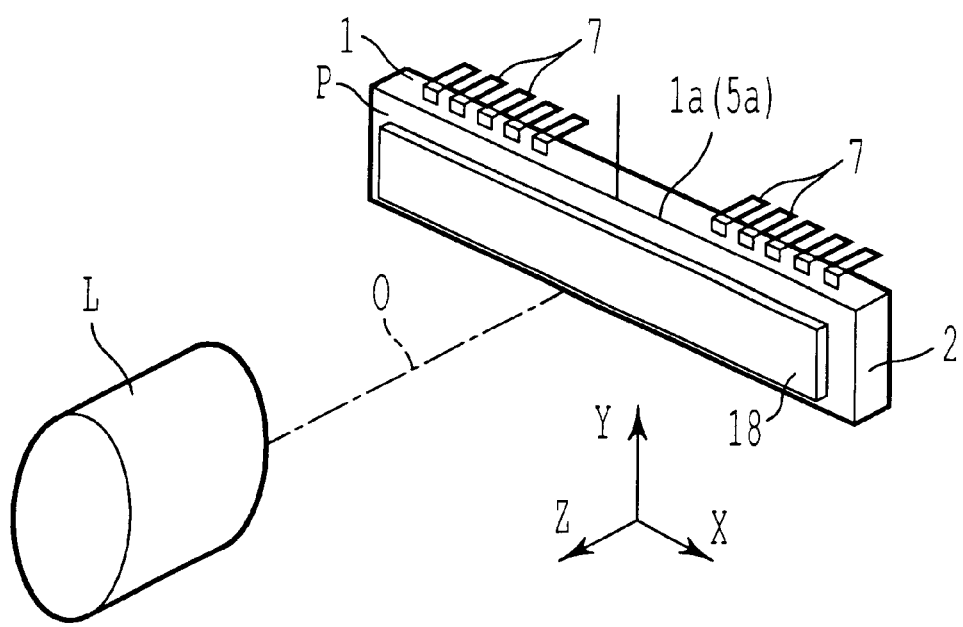
FIG. 4 is a perspective view to show a solid state image sensing device and its supporting structure in accordance with the other embodiment of present invention.

Next FIG. 4 is a perspective view to show the solid state image sensing device and supporting structure thereof in accordance with the other embodiment of the present invention, and in the solid state image sensing device 1 in accordance with this embodiment it is conspicuous that the reference plane P for attaching which is disposed on the upper surface (front surface) of the package is a plane which is orthogonal to an optical axis O of the light which is incident onto the incoming light receiving surface (photoelectric conversion element line) of semiconductor chip 3 through the cover glass 15. In other words, when in case the optical axis O is selected to be the Z axis, the reference plane P for attaching onto the housing (not shown) of image sensing apparatus is a parallel plane with the X-Y plane.

By this reason in the supporting structure for the solid state image sensing device in accordance with the embodiment shown in FIG. 4 it is made possible that positional displacement in the α direction is minimized when the solid state image sensing device 1 is held by the holding means (See FIG. 17) and the adhering process and the adjusting process are performed by means of holding in the state in which the front surface 1*a* (contacted surface) of the solid state image sensing device 1 or the upper surface 5*a* of package body and the identical plane are selected as the reference plane P.

Figure 5A:
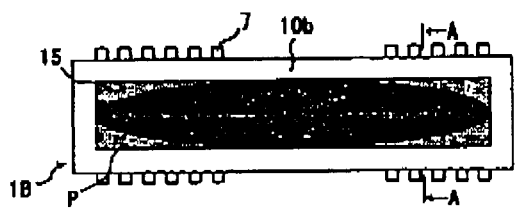
FIGS. 5(A), (B) and (C) are a plan view, a back view and a cross sectional view cut along A—A line to show a structure of the Cer DIP type solid state image sensing device (CCD) 1B in accordance with the other embodiment of present invention.
Figure 5C:
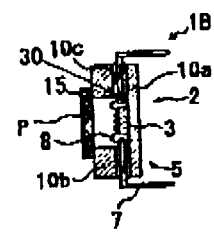
Figure 5B:
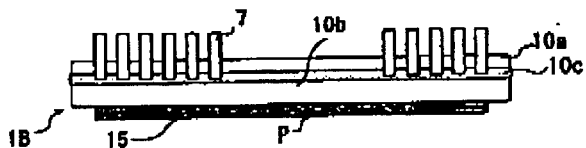

Next FIGS. 5(A), (B) and (C) are a plan view, a back view and a cross sectional view cut along A—A line to show a structure of the Cer DIP type solid state image sensing device (CCD) 1B in accordance with the other embodiment of the present invention, in this embodiment the reference plane P which is used when the solid state image sensing device is mounted to a housing of the image input apparatus (not shown) is arranged on a front surface of the cover glass 15, and at the same time the reference plane P on cover glass 15 is parallel to the upper surface of base frame 10*a*, in other words a surface 30 on which the semiconductor chip 3 is mounted.

Herein the structure in which the reference plane P is arranged on the front surface of cover glass 15 can be applied to the resin packaging type solid state image sensing device 1C shown in FIG. 16, even for this case the reference plane is selected on the front surface of cover glass 15 which seals the concave portion of resin package.

As described above by means of arrangement in which the reference plane P for attaching the solid state image sensing device is selected on the cover glass 15, the parallelity in relation to the incoming light receiving portion (photoelectric conversion element) of semiconductor chip 3 can be easily attained, the solid state image sensing device can be located with a high degree of accuracy in regard to the solid state image sensing device holding member 21, and at the same time a constraint condition on layout can be minimized when the solid state image sensing device is mounted onto the image input apparatus because the cover glass is located in a portion which is the nearest to the lens of solid state image sensing device.

Figure 6:
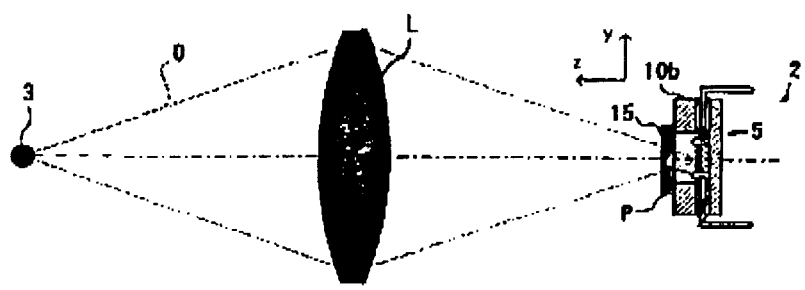
FIG. 6 is a schematic illustration to show an image forming lens L when it is viewed from the X axis.

FIG. 6 is a schematic illustration to show an image forming lens L when it is viewed from the X axis, and the structure of solid state image sensing device 1 is also a schematic illustration with out showing the housing of image input apparatus. The light (optical image) from the object to be image picked up D is gathered and focused through the lens L on the solid state image sensing device 1. At this time the reference plane P for attaching the solid state image sensing device onto a housing (not shown) of the image input apparatus is arranged within the upper surface of cover glass 15 in a position where the flux O focused by the lens L is not interfered. By this arrangement because an adequate portion of the cover glass 15 can be selected as the reference plane P where the flux O for solid state image sensing device 1 is avoided, in order to be held, an appropriate adjusting operation can be performed when the solid state image sensing device 1 is held by the holding means and the adhering process and the adjusting process is performed.

Figure 7A:
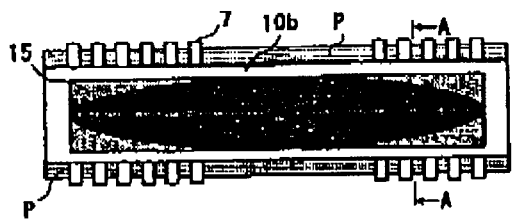
FIGS. 7(A), (B) and (C) are a plan view, a back view and a cross sectional view cut along A—A line to show a structure of the Cer DIP type solid state image sensing device (CCD) in accordance with the other embodiment of present invention.

Next, FIGS. 7(A), (B) and (C) are a plan view, a back view and a cross sectional view cut along A—A line to show a structure of the Cer DIP type solid state image sensing device (CCD) in accordance with the other embodiment of the present invention, in the Cer DIP type solid state image sensing device 1 in accordance with this embodiment the reference plane P for attaching onto a housing of the image input apparatus (not shown) is arranged on a surface of the base frame 10*a*. At this time because the semiconductor chip 3 having photoelectric conversion element is mounted on the flat surface 30 of the base fame 10*a*, the flat surface 30 as the attaching surface for semiconductor chip and the reference plane P for attaching onto the housing (not shown) of image input apparatus are both on the identical plane and at the same time they are parallel to each other.

Figure 7C:
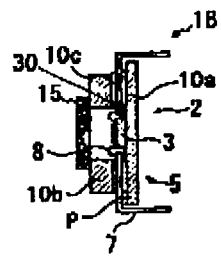
Figure 7B:
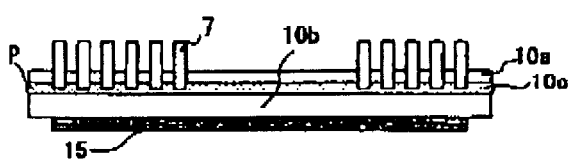
Figure 8A:
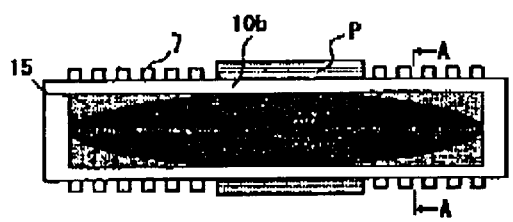
FIGS. 8(A), (B) and (C) are a plan view, a back view and a cross sectional view cut along A—A line to show a structure of the Cer DIP type solid state image sensing device (CCD) in accordance with the other embodiment of present invention.
Figure 8C:
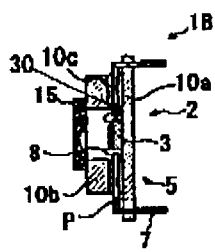
Figure 8B:
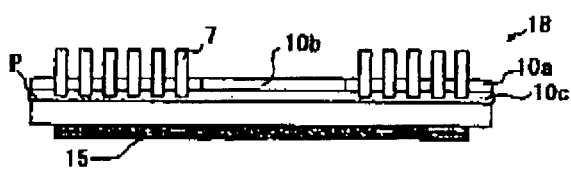

FIGS. 8(A), (B) and (C) are a plan view, a back view and a cross sectional view cut along A—A line to show a structure of the Cer DIP type solid state image sensing device in accordance with the other embodiment of the present invention, for the Cer DIP type solid state image sensing device 1 in accordance with this embodiment it is identical to the solid state image sensing device shown in FIG. 7 in a point that the reference plane P for attaching onto the housing (not shown) of image input apparatus is arranged on the surface of base frame 10*a*, herein in the embodiment shown in FIG. 7 a longer side of the base frame 10*a* is made to be entirely expanded along the Y direction in relation to the window frame 10*b*, however in the embodiment shown in FIG. 8 only a central portion of the longer side of base frame 10*a* is made larger than that of the window frame 10*b* with protruding into side direction, and a surface of the protruding portions is used as the reference plane P for attaching onto the housing (not shown) of image input apparatus. By this arrangement it is convenient because the other portion on the longer side of base frame has the same dimension as that of the window frame 10*b*.

At this time because the semiconductor chip 3 having photoelectric conversion element is mounted on the flat surface 30 of base frame 10*a*, the flat surface 30 as the attaching surface onto which the semiconductor chip is mounted, and the reference plane P for attaching onto the housing (not shown) of image input apparatus are on the identical plane and they are parallel to each other.

Figure 9A:
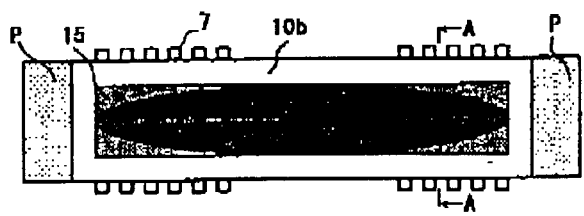
FIGS. 9(A), (B) and (C) are a plan view, a back view and a cross sectional view cut along A—A line to show a structure of the Cer DIP type solid state image sensing device (CCD) 1B in accordance with the present invention.

Next FIGS. 9(A), (B) and (C) are a plan view, a back view and a cross sectional view cut along A—A line to show a structure of the Cer DIP type solid state image sensing device 1B in accordance with the present invention, the reference plane P which is used when this Cer DIP type solid state image sensing device 1 is mounted onto the housing (not shown) of image input apparatus, is arranged on the window frame 10*b*, on cover glass 15 or on a surface of the base frame 10*a* which is protruding into both two ends direction of the longer side of solid state image sensing device.

Figure 9C:
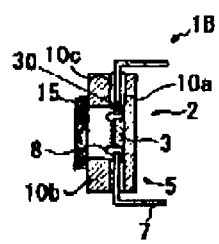
Figure 9B:
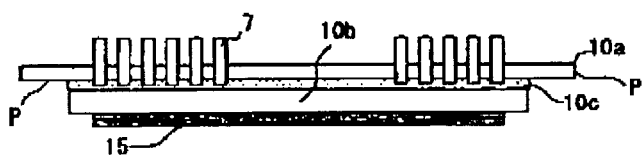

An arrangement of the reference plane P shown in FIG. 9 can be applied to the package structure for the resin packaging type solid state image sensing device 1C and in this case the reference plane P is made to be arranged on a protruding surface of the both two ends direction of longer side of the resin made package.

Figure 10A:
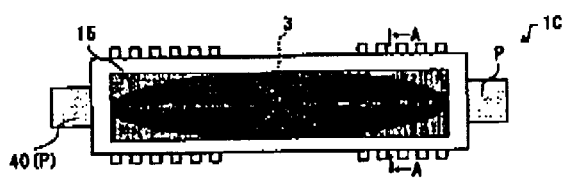
FIGS. 10(A), (B) and (C) are a plan view, a back view and a cross sectional view cut along A—A line to show a structure of a resin packaging type solid state image sensing device (CCD) 1C in accordance with the other embodiment of present invention.

Next FIGS. 10(A), (B) and (C) are a plan view, a back view and a cross sectional view cut along A—A line to show a structure of a resin packaging type solid state image sensing device 1C in accordance with the other embodiment of the present invention. The solid state image sensing device 1C has a structure in that the concave portion 6 is sealed with the cover glass 15 with a state which the semiconductor chip 3 is mounted in the concave portion 6 of package 2. The package 2 includes the package body 5 which is made of an insulating material such as resin and the like, a metal plate 40 which is disposed on a flat inner bottom surface of the concave portion 6 and the lead frame 7 which passes through the side walls of package body 5 and which are connected via the lead wires 8 with the electrodes of semiconductor chip 3 on the metal plate 40.

In the solid state image sensing device 1C the reference plane P which is used when the solid state image sensing device is mounted onto the housing (not shown) of image input apparatus is arranged on the metal plate 40. To be more precise the metal plate 40 is passing and protruding through side walls which are located in the both end portions of longer side of the package body 5, the surface of protruded portion is selected as the reference plane P. The attaching surface for the semiconductor chip which is corresponding to the inner bottom surface of concave portion 6 and the reference plane P which is used when the solid state image sensing device is mounted onto the housing (not shown) of image input apparatus is on the identical plane and at the same time they are parallel to each other.

Figure 10C:
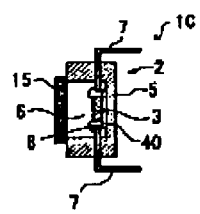
Figure 10B:
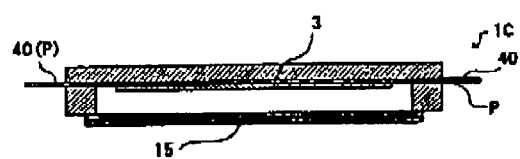
Figure 11A:
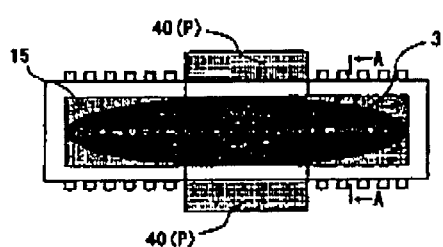
FIGS. 11(A) and (B) are a plan view and a cross sectional view cut along A—A line to show a structure of the solid state image sensing device (CCD) in accordance with the other embodiment of present invention.
Figure 11B:
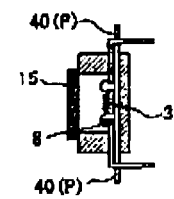
Figure 12A:
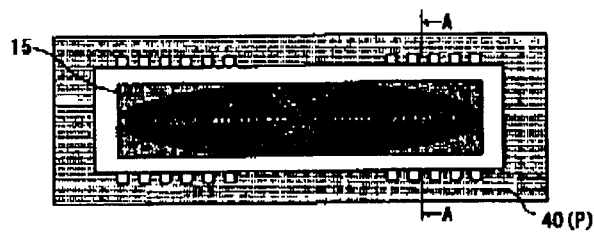
FIGS. 12(A) and (B) are a plan view and a cross sectional view cut along A—A line to show a structure of the solid state image sensing device (CCD) in accordance with the other embodiment of present invention.
Figure 12B:
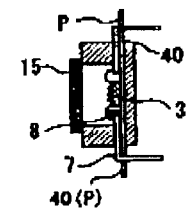

At this point in the resin packaging type solid state image sensing device 1C in accordance with the embodiment shown in FIG. 10 the both end portions of longer side of the metal plate 40 on which the semiconductor chip 3 having photoelectric conversion element mounted are protruding outwardly from the side walls of package body 5, however it may be also recommendable that the metal plate 40 is protruding in a shorter side direction of it from a central portion of the side which is extending in the longer direction as the solid state image sensing device shown in FIG. 11, or the metal plate 40 has a structure in which the metal plate 40 is protruding outwardly from all around of side walls of the package body 5 and the protruding surface is selected as the reference plane P as shown in FIG. 12.

By the arrangement that the reference plane P for attaching is arranged on the surface protruding to both ends direction of the package body such as the respective embodiments shown in FIG. 7–FIG. 12, a pitch of attaching portion onto the housing of solid state image sensing device can be expanded and as the result of this, the image input apparatus is made strong against a force in rotational direction around the optical axis so as to improve the picture quality.

As above described in accordance with the present invention as is the case with the invention disclosed in Japanese Patent Publication No. Hei 10 (1998)-309801, with regard to an adverse effect of the shrinkage of adhesive material which is caused when the solid state image sensing device is fixed (when the adhesive materials are hardened), because the shrinkage of adhesive material are converted into a motion that the intermediate holding member comes nearer to the solid state image sensing device and the solid state image sensing device holding member, an occurrence of misalignment of the solid state image sensing device itself can be cut down, and there is realized the solid state image sensing device structure in that the solid state image sensing device can be located with a high degree of accuracy. In addition the solid state image sensing device structure in that the whole structure can be made moving in micro motion along the five direction of X, Y, Z, α and γ to perform the positional adjustment, can be realized by means that a sliding adjustment on two vertically located surfaces 25*a* and 25*b* among the adhering surfaces is achieved.

In addition, by means that the reference plane for attaching the solid state image sensing device is arranged on the cover glass, a parallelism with the incoming light receiving portion (photoelectric conversion element) of semiconductor chip can be easily attained and the solid state image sensing device can be performed the locating and positional adjustment in relation to the holding member for solid state image sensing device with a high degree of accuracy, and at the same time a constraint condition on layout can be minimized when the solid state image sensing device is mounted onto the image input apparatus because the cover glass is located in a portion which is the nearest to the lens of solid state image sensing device.

Further, by means of arranging the reference plane for attaching the solid state image sensing device on the window frame, the structure for solid state image sensing device can be realized in that a parallelity with the incoming light receiving portion of photoelectric conversion element can be easily attained and the solid state image sensing device can be performed the locating and positional adjustment in relation to the holding member for solid state image sensing device with a high degree of accuracy.

Moreover, the structure for solid state image sensing device can be realized in that a parallelity with the incoming light receiving portion of photoelectric conversion element can be easily attained and the solid state image sensing device can be performed the locating and positional adjustment in relation to the holding member for solid state image sensing device with a high degree of accuracy by means that a reference plane for attaching the solid state image sensing device is arranged on the metal plate, the upper surface of cover glass, the bottom surface (upper surface of bottom plate) of concave portion in the package body and the base frame respectively.

Still further, by the arrangement that the reference plane P for attaching is arranged on the surface protruding to both ends direction of the CCD package a pitch of attaching portion onto the housing of solid state image sensing device can be expanded and as the result of this, the image input apparatus is made strong against a force in rotational direction around the optical axis so as to improve the picture quality.

What is claimed is:

1. A supporting structure for a solid state image sensing device, comprising:
    an intermediate holding member to which said solid state image sensing device is attached; and
    a holding member to which said intermediate holding member is attached, said image sensing device including:
        a semiconductor chip for image sensing having at least one photoelectric conversion element line, and
        a package which has a concave portion into which the semiconductor chip is received;
    a reference plane for attaching provided on said package, said intermediate holding member fixed to said reference plane,
    said reference plane being parallel to an inner bottom surface of said concave portion on which said semiconductor chip is mounted.

2. The supporting structure according to claim 1, said package comprises:
    an insulating package body in which the semiconductor chip is mounted on a flat inner bottom surface of the concave portion,
    a transparent cover glass fixed on an upper surface of an outer frame of the concave portion of the insulating package body for sealing the concave portion, and
    a lead frame connected to electrodes on the semiconductor chip within the insulating package body and extending outwardly through the insulating package body, wherein
        said reference plane for attaching comprises a surface located orthogonally to an optical axis of light coming into an incoming light receiving surface of said semiconductor chip through said cover glass.

3. The supporting structure according to claim 1, wherein said package comprises a package body including:
    a base frame comprising a flat ceramic plate constituting a bottom plate, and
    an annular window frame made of ceramic fixed on one surface of the base frame through a sealing glass;
    a transparent cover glass fixed on an upper surface of an outer frame of said window frame; and
    a lead frame extending outwardly through said sealing glass.

4. The supporting structure according to claim 2, wherein said insulating package body is made of resin;
    said supporting structure comprises a mechanism in which said semiconductor chip is mounted on a metal plate located on an inner bottom surface of the concave portion of the insulating package body; and
    said reference plane for attaching is arranged on said metal plate.

5. The supporting structure according to claim 2, wherein said reference plane is arranged on said insulating package.

6. The supporting structure according to claim 2, wherein said reference plane is arranged on said cover glass.

7. The supporting structure according to claim 2, wherein said reference plane is arranged on a surface of the outer frame of the concave portion of said insulating package body.

8. The supporting structure according to claim 3, wherein said reference plane is arranged on an upper surface of said window frame.

9. The supporting structure according to claim 3, wherein said reference plane is arranged on an upper surface of said base frame.

10. The supporting structure according to claim 4, wherein said reference plane is arranged on a bottom surface of said concave portion of the insulating package body.

11. The supporting structure according to claim 3, wherein said reference plane is arranged on a protruding surface projecting from the bottom plate of said base frame.

12. The supporting structure according to claim 3, wherein said reference plane is arranged on a protruding surface projecting from the metal plate.

* * * * *